(12) United States Patent
Chuang et al.

(10) Patent No.: US 12,324,176 B2
(45) Date of Patent: Jun. 3, 2025

(54) IMPLANT BLOCKING FOR A TRENCH OR FinFET WITHOUT AN ADDITIONAL MASK

(71) Applicant: Texas Instruments Incorporated, Dallas, TX (US)

(72) Inventors: Ming-Yeh Chuang, McKinney, TX (US); Abbas Ali, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 469 days.

(21) Appl. No.: 17/462,801

(22) Filed: Aug. 31, 2021

(65) Prior Publication Data

US 2022/0123130 A1    Apr. 21, 2022

Related U.S. Application Data

(60) Provisional application No. 63/093,665, filed on Oct. 19, 2020.

(51) Int. Cl.
*H10D 30/01*    (2025.01)
*H10D 30/62*    (2025.01)

(52) U.S. Cl.
CPC ..... *H10D 30/0241* (2025.01); *H10D 30/6217* (2025.01); *H10D 30/6219* (2025.01)

(58) Field of Classification Search
CPC ..... H01L 21/823431; H01L 21/823821; H01L 21/26586; H01L 29/66681; H01L 29/7816; H01L 29/7835; H01L 29/7856; H01L 29/66803; H01L 29/66795; H01L 29/785–7851; H01L 27/0886; H01L 27/1211; H01L 27/0924; H01L 21/265–266

See application file for complete search history.

(56) References Cited

U.S. PATENT DOCUMENTS

| | | | | |
|---|---|---|---|---|
| 2014/0008733 | A1* | 1/2014 | Shrivastava | H01L 29/7835 257/E29.264 |
| 2014/0183629 | A1* | 7/2014 | Meiser | H01L 29/7816 438/286 |
| 2017/0345916 | A1* | 11/2017 | Hong | H01L 29/66803 |
| 2020/0135469 | A1* | 4/2020 | Liu | H01L 21/26513 |
| 2021/0159332 | A1* | 5/2021 | Zhaomeng | H01L 29/66689 |

FOREIGN PATENT DOCUMENTS

| | | | |
|---|---|---|---|
| CN | 105470136 A | * | 4/2016 |
| KR | 20210102711 A | * | 8/2021 |

* cited by examiner

*Primary Examiner* — Evan G Clinton
(74) *Attorney, Agent, or Firm* — Andrew R. Ralston; Frank D. Cimino

(57) ABSTRACT

A method of fabricating an integrated circuit includes forming and patterning a hardmask over a substrate such that the patterned hardmask exposes regions of the substrate. The exposed regions are etched, thereby forming trenches and a semiconductor fin between the trenches. Prior to removing the hardmask, a photoresist layer is formed and patterned, thereby exposing a section of the semiconductor fin. A dopant is implanted into the exposed section through the hardmask.

20 Claims, 10 Drawing Sheets

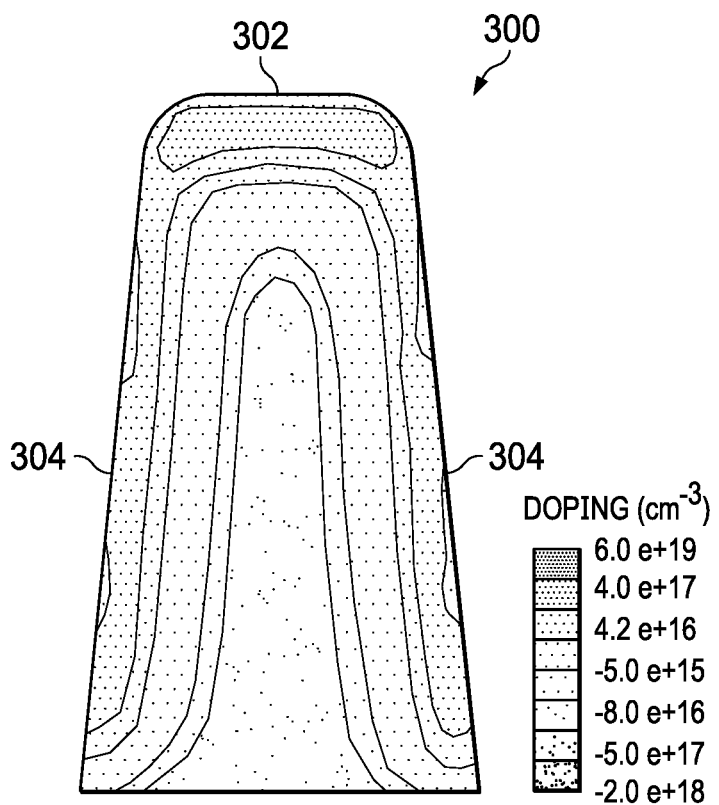
FIG. 3
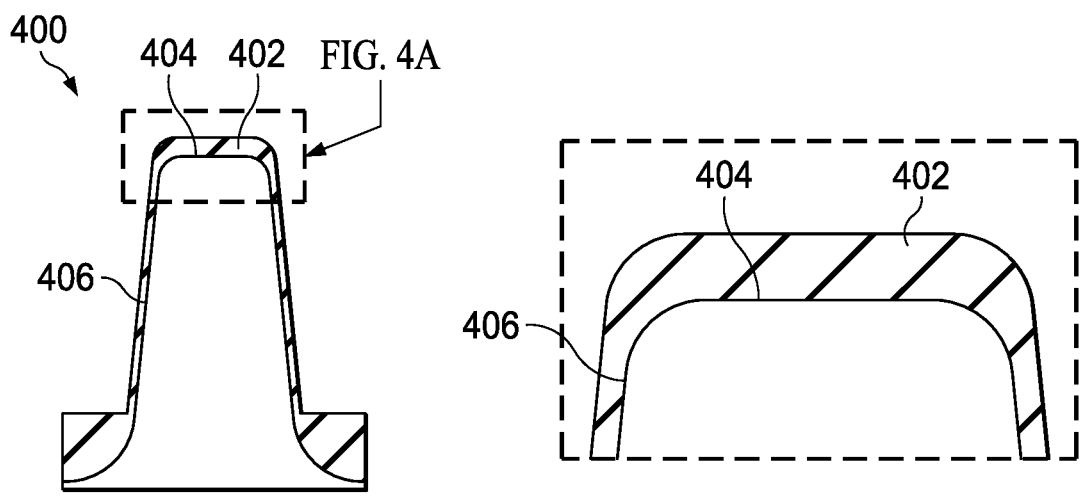
FIG. 4
FIG. 4A

IMPLANT BLOCKING FOR A TRENCH OR FinFET WITHOUT AN ADDITIONAL MASK

CROSS-REFERENCE TO RELATED APPLICATIONS

This non-provisional application claims priority based upon the following prior United States provisional patent application(s): (i) "Using Trench Etch Hard Mask as an Implant Blocking Layer to Adjust The Doping at Different Facet of the Trench or Fin of a finFET," Application No. 63/093,665, filed Oct. 19, 2020, in the name(s) of Ming-Yeh Chuang and Abbas Ali, which is hereby incorporated by reference in its entirety.

BACKGROUND

When implanting dopants in structures such as trenches or the fins of a fin field-effect transistor (FinFET), the depth of the structures may increase the difficulty of providing a uniformly doped device.

SUMMARY

Disclosed implementations reuse a trench-etch hardmask to block implants from an upper surface of trenches or fins. Some implants into the fin, e.g., into the drift region of a FinFET, can be incorporated into the process loop that creates the trenches and fins, so that the hardmask can remain on the upper surface of the fins during multiple angled implants. Blocking multiple implants from the upper surface allows more adjustments to the doping and greater control of the doping process. The disclosed process may provide one or more of the following advantages: greater uniformity in the doping, increased performance of the device, and no costs added to the process.

In one aspect, an embodiment of a method of fabricating an integrated circuit is disclosed. The method includes forming and patterning a hardmask over a substrate, the patterned hardmask exposing regions of the substrate; etching the exposed regions thereby forming trenches and a semiconductor fin between the trenches; and prior to removing the hardmask, forming and patterning a photoresist layer thereby exposing a section of the semiconductor fin and implanting a dopant into the exposed section through the hardmask.

In another aspect, an embodiment of a method of fabricating an integrated circuit is disclosed. The method includes forming and patterning a hardmask over a semiconductor substrate, the patterned hardmask exposing regions of the semiconductor substrate; etching the exposed regions to form trenches in the semiconductor substrate and a semiconductor fin between the trenches; depositing a photoresist layer over the trenches, the semiconductor fin, and the patterned hardmask; patterning the photoresist layer to expose a section of the semiconductor fin and the hardmask; and implanting a dopant through the exposed hardmask into the exposed section of the semiconductor fin to form a drift region, the implanting using multiple implant angles relative to sidewalls of the fin.

In yet another aspect, an embodiment of an integrated circuit containing a FinFET is disclosed. The integrated circuit includes a first semiconductor fin located over a substrate, the first semiconductor fin including a source region, a body region, a drift region, and a drain region, the first semiconductor fin and each of the source region, the body region, the drift region, and the drain region having a respective top surface and respective sidewalls; and a field plate insulator over the top surface and the sidewalls of the drift region, wherein the drift region is doped with a first dopant and a second dopant, a concentration of the first dopant is greater on the respective top surface and a concentration of the second dopant is greater on the respective sidewalls.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 3 depicts representative dopant concentration in a cross-section of a FinFET that has been doped using a baseline beam line implant;

FIG. 4 depicts a cross-sectional view of a fin having a cap oxide to provide greater uniformity to the dopant implants according to a baseline implementation of a FinFet;

FIG. 4A depicts a close-up of the top of the fin of FIG. 4;

DETAILED DESCRIPTION

Figure 1A:
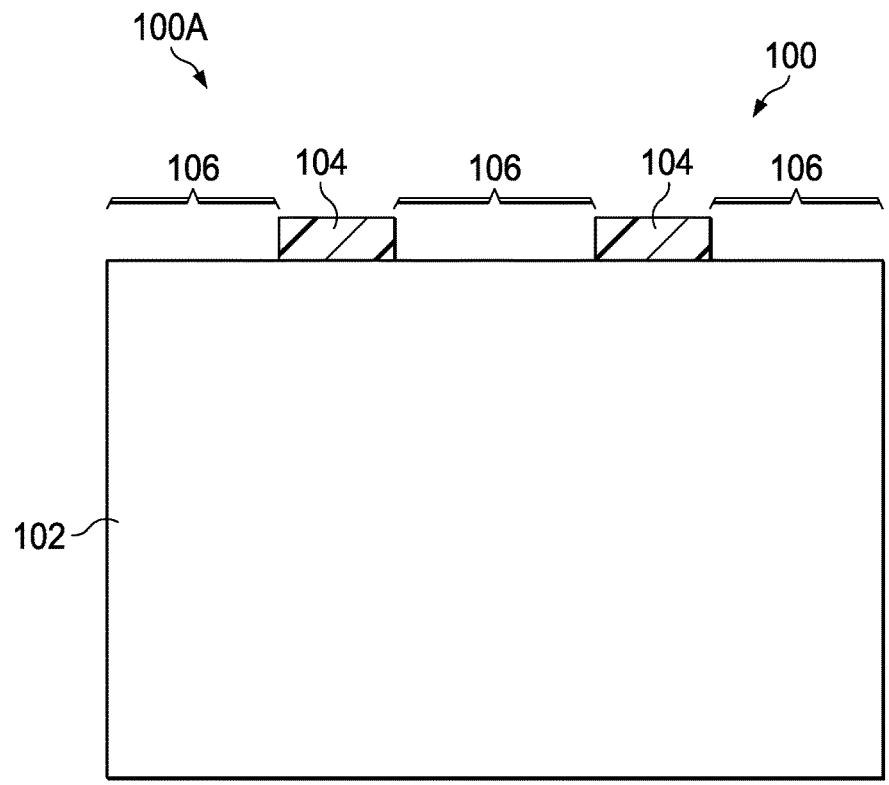
FIGS. 1A through 1M illustrate various stages during the fabrication of an integrated circuit containing a FinFET according to an implementation of the disclosure.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Hardmasks (also spelled hard masks) used in lithography processes play a vital role in pattern transfer to a desired substrate. Depending on the substrate to be etched, the materials used as hardmasks exhibit etch resistance to either oxygen rich plasma or halogen rich plasma, as well as good wet removability and fill capability in high aspect ratio contacts and trenches. Silicon nitride and silicon oxide are typical hardmask materials used to etch silicon.

A FinFET is a type of non-planar transistor, or "3D" transistor and is expected to be increasingly used in semiconductor device fabrication. A single FinFET transistor may contain several fins, arranged side-by-side and all covered by the same gate, which act electrically as one to increase drive strength and performance. In such FinFETs, the width of the transistor channel may be oriented in or near the vertical direction, that is, in a direction perpendicular to the major surface of the substrate, while the length of the channel is oriented parallel to the major surface of the substrate. With such orientation of the channel, FinFETs can be constructed to have a larger width conduction channel than planar FETs so as to produce larger current drive than planar FETs that occupy the same amount of die area (the area parallel to the major surface of the substrate).

The fins of a FinFET typically need multiple dopant implants, provided at different angles, to ensure that all surfaces of the fin are exposed to the implantation. However, some regions of the fins may be exposed to multiple implants while other regions receive only a single implant. FIG. 3 depicts in cross-section the concentration of dopant determined by modeling in a fin 300 that has received a baseline beam line implant that uses a four-rotation implant. In this example, the dopant may be phosphorous implanted with an energy of 15 keV at an angle of 30°. As seen in this figure, the top 302 of the fin 300 has received a much larger dose of dopants than the sidewalls 304 of the fin 300, e.g. about 4e17 $cm^{-3}$ at the top 302 as compared to about 4e16 $cm^3$ at the sides 304, an order of magnitude difference. In this example, the top 302 will receive dopants during each of the four angled implants, while the sides 304 will typically only receive dopants during one of the implants. The increased dopant in regions at the top of the fin relative to regions at the sidewalls of the fin may reduce the breakdown voltage of the FinFET.

One baseline approach to addressing the uneven deposition of dopants is illustrated in FIG. 4 and FIG. 4A, in which an implant screen 402 has been formed on a fin 400. In one example implementation, the implant screen 402 includes 100 Å of an isotropic oxide that forms a conformal layer on both a top 404 and sidewalls 406 of the fin 400 and also includes 400 Å of an anisotropic oxide that is deposited primarily on the top 404 of the fin 400. The implant screen 402 can be formed after the fin 400 has been etched and the hardmask removed. In one implementation of the fin 400, two N-type dopants are implanted into the fin 400; a first N-type dopant (not specifically shown) preferentially penetrates the implant screen 402 over the top 404 of the fin 400 and a second N-type dopant (not specifically shown) preferentially penetrates the implant screen 402 over the sidewalls 406 of the fin 400. The concentration of N-type dopants on the top 404 of the fin 400 may be within ±50% of the concentration of N-type dopants on the sidewalls 406 of the fin 400. Additional details of the approach shown in FIG. 4 and FIG. 4A can be found in U.S. patent application Ser. No. 17/138,647 (the '647 application), filed 2020 Dec. 30, which is owned in common with the present application and which is hereby incorporated by reference in its entirety. This solution improves the distribution of dopants in the fin, but may be undesirable in some cases due to added process complexity to implement the implant screen 402.

FIGS. 1A-1M disclose various views of an integrated circuit 100 at a number of stages during the fabrication of a FinFET according to an implementation of the disclosure. In FIG. 1A, a cross-section 100A of a substrate 102 is shown. The substrate 102 may be a bulk semiconductor such as silicon, silicon on insulator (SOI), silicon-germanium, gallium arsenide, etc. In one example, a reduced surface field (RESURF) layer (not specifically shown) is formed on the oxide layer of an SOI substrate. In another example, an N-type layer is formed in a bulk silicon substrate and a RESURF layer is formed on the N-type layer. In some implementations, an epitaxial layer (not specifically shown), which may be monocrystalline silicon, is grown on or over the substrate 102, with buried and/or well layers formed before or after forming the epitaxial layer, as appropriate to the layer type. For the purpose of this discussion the substrate 102 may include any such modifications without further elaboration.

In the example of FIG. 1A, a hardmask layer has been deposited and patterned to form a patterned hardmask 104 that exposes regions 106 of the substrate 102 in which trenches are to be formed. In one implementation the patterned hardmask 104 is formed of silicon nitride, although other hardmask materials may also be used. The substrate 102 is then etched at exposed regions 106 to form a first semiconductor fin 108A and a second semiconductor fin 108B over the substrate 102 and underneath the patterned hardmask 104, with trenches 110 formed between the semiconductor fins 108, as shown in a cross-section 100B in FIG. 1B. Although only one or two semiconductor fins 108 are specifically shown in each of the present figures, a FinFET may have additional semiconductor fins 108 that are controlled by a same gate. The etch process may be similar to the process that is used to etch silicon for shallow trench isolation (STI) and is not further elaborated. At this point in the baseline processing, the patterned hardmask 104 is typically removed. However, in the present implementation, the patterned hardmask 104 will remain through the implantations for a drift region of the FinFET.

Figure 1B:
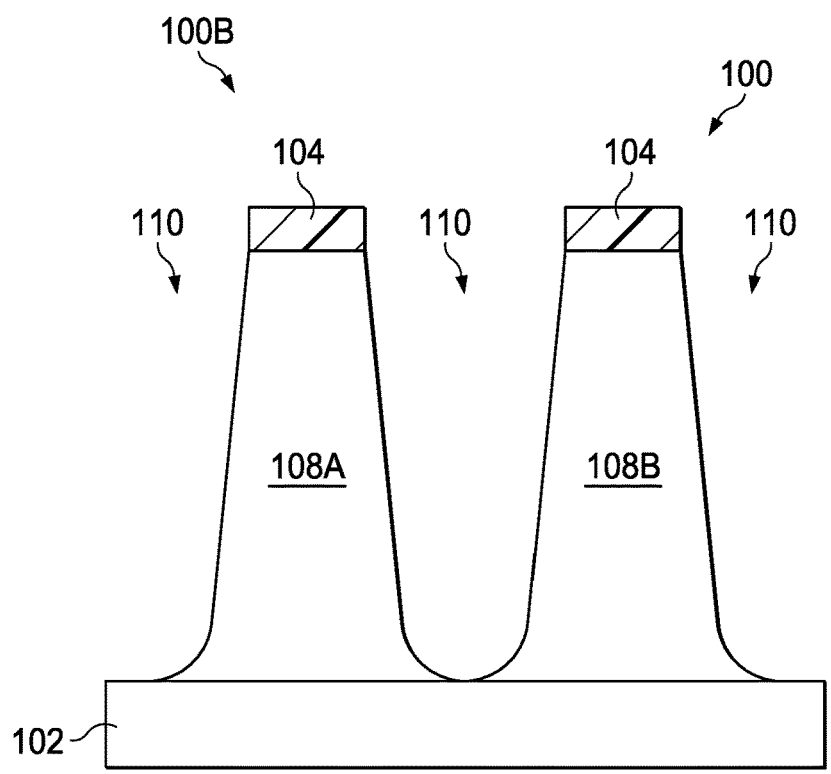
Figure 1C:
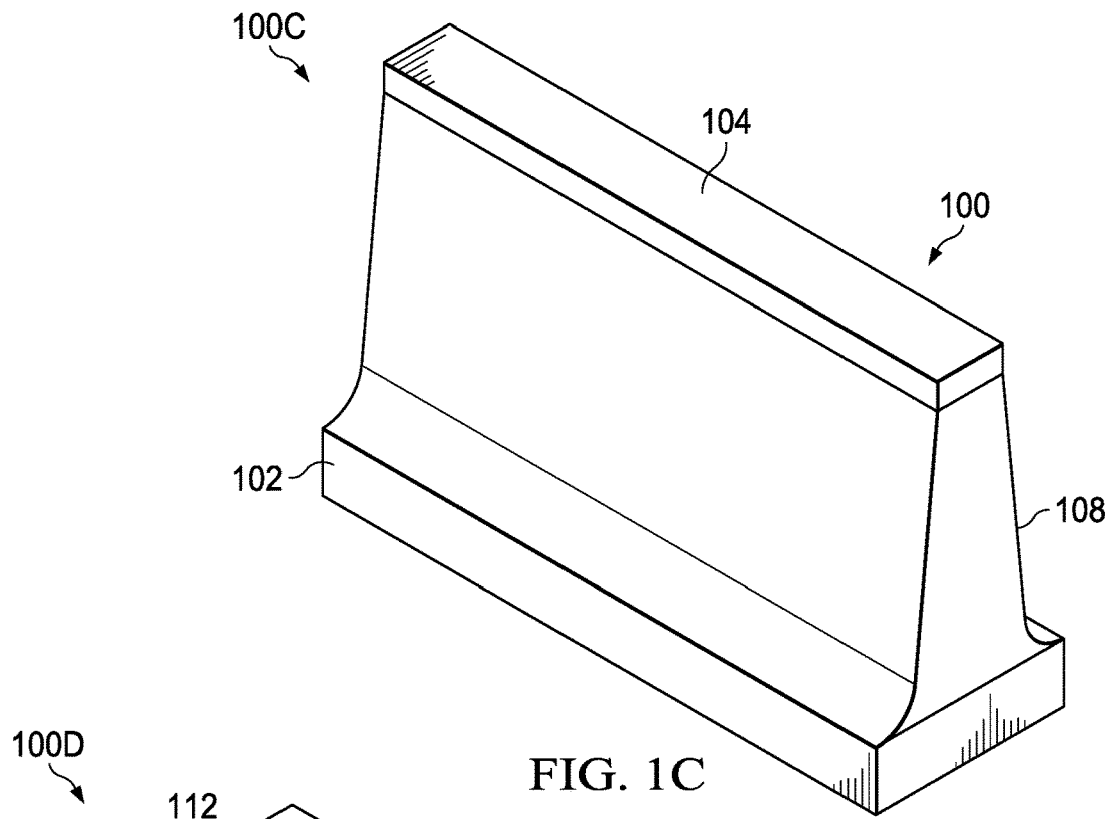
Figure 1D:
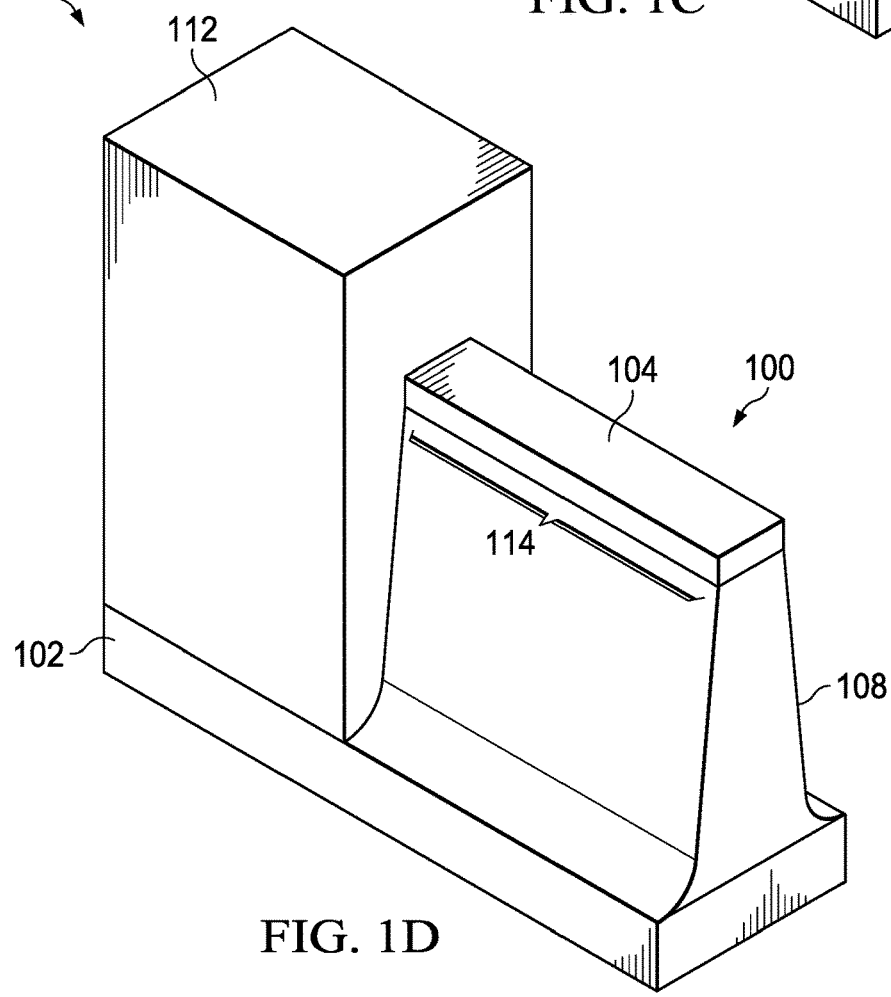

FIGS. 1A and 1B have both shown a cross-section of the substrate 102 and the semiconductor fins 108. FIG. 1C depicts a perspective view 100C of a single semiconductor fin 108 that may provide a clearer understanding of a fin. In FIG. 1C, the semiconductor fin 108 is formed over the substrate 102 and the patterned hardmask 104 lies over the semiconductor fin 108. FIG. 1D depicts a perspective view 100D of the semiconductor fin 108 in which a patterned photoresist 112 has been formed to expose a section 114 of the semiconductor fin 108. In one implementation, the exposed section 114 of the semiconductor fin 108 is destined to become the drift region for the FinFET.

Figure 1E:
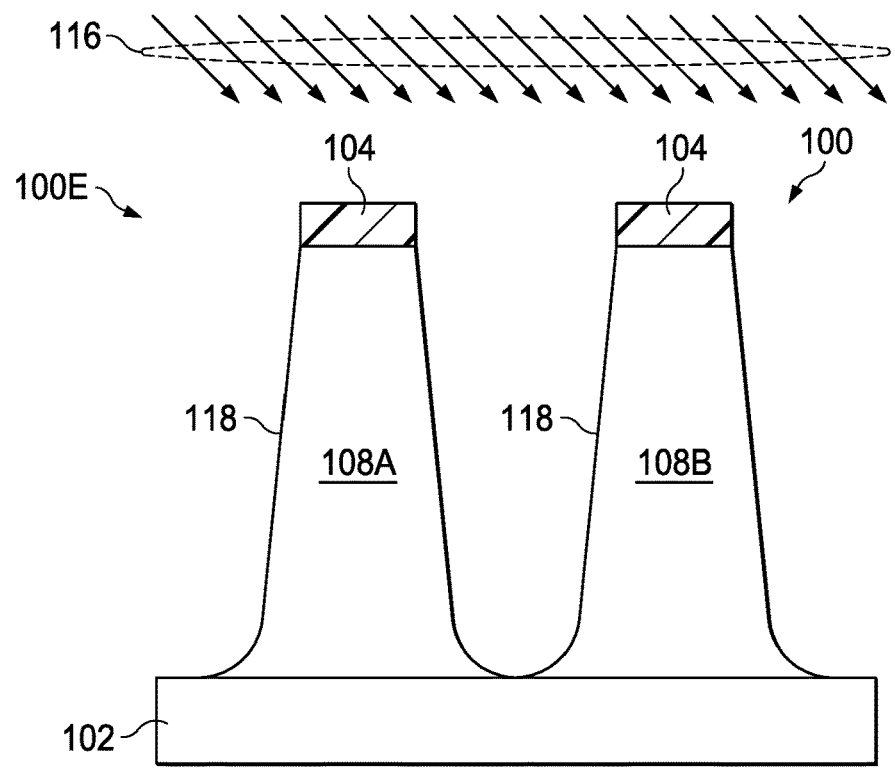
Figure 1F:
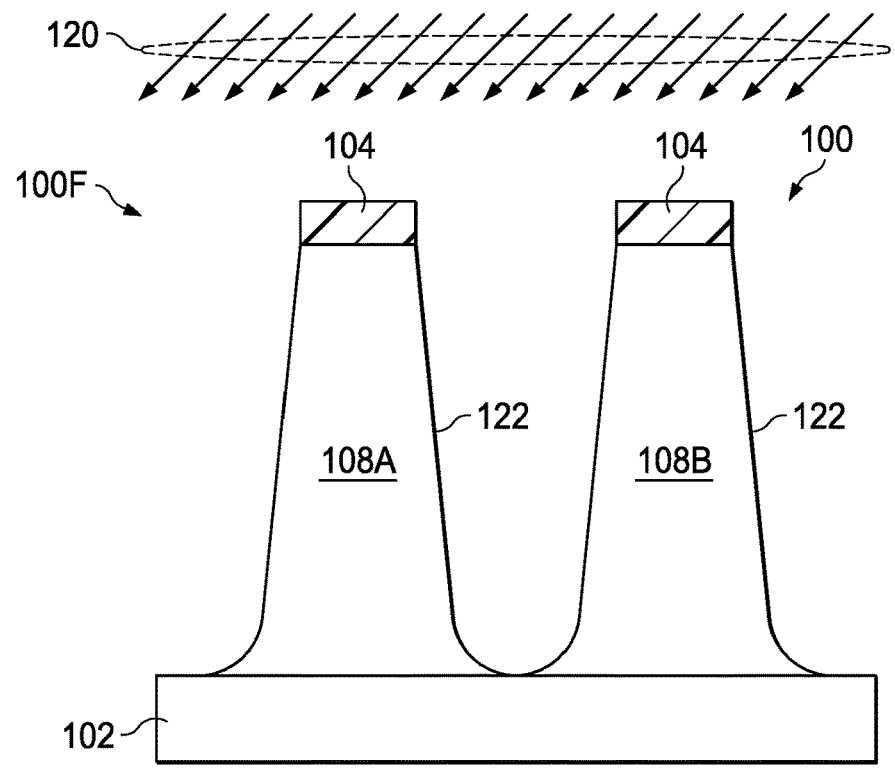

Once the patterned photoresist 112 has been formed, dopants can be implanted into the semiconductor fins 108. FIG. 1E is a cross-sectional view 100E of a first angled implant 116, which will primarily implant dopants into first sidewalls 118 of the first semiconductor fin 108A and the second semiconductor fin 108B. Similarly, FIG. 1F is a cross-sectional view 100F of a second angled implant 120, which will primarily implant dopants into second sidewalls 122 of the first semiconductor fin 108A and the second semiconductor fin 108B. It will be understood that while these representations show the first angled implant 116 and the second angled implant 120 as being provided from different directions, such angles may physically be implemented by rotation (twist) and tilt of a platen that supports the substrate 102 during implant processing while the source of the dopant remains unchanged.

In one implementation, the disclosed process uses a 4-rotation implant. Thus in addition to the first angled implant 116 and the second angled implant 120, a third angled implant (not specifically shown) may be provided at an angle that is directed along a long axis of the semiconductor fins 108, and a fourth angled implant (not specifically shown) may be provided with a rotation that is 180° from the third angled implant. In other examples a plasma doping process may be used, with the implant angles being relative to a mean dopant flux. In one example, the dopant may be phosphorous implanted with an energy of 35 keV at an angle of 30°. Once all implants into the exposed section 114 (FIG. 1D) of the semiconductor fin 108 are completed, the patterned photoresist 112 (FIG. 1D) and the patterned hardmask 104 can be removed.

In one implementation in which the semiconductor fins 108 are the fins of an N-type FinFET, the dopants used in the implants may be any of the elements in column five (also referred to as group 15) of the periodic table typically used as N-type dopants, e.g., phosphorus, arsenic, antimony, etc., either singly or in combination. Although in some baseline implementations the concentration of majority carrier dopants on the top of the semiconductor fins could be four times the concentration on the sidewalls, e.g., a 4:1 ratio, by retaining the patterned hardmask 104 during the dopant implant process, this ratio may be advantageously reduced.

Because the hardmask 104 is used for two purposes, its thickness may be selected to serve these purposes properly. For example, the hardmask 104 should be thick enough to mask the substrate during the fin etch without completely eroding. Further, the hardmask 104 remaining after the fin etch should be thick enough to provide the desired degree of screening during the implants 116 and 120. In some examples the thickness may be 400 Å to 500 Å for the implant, and the thickness may be selected to minimize variation of the dopant concentration between the top and sides of the fin. The hardmask 104 may be deposited with a greater initial thickness that accounts for erosion during the fin etch. In one example, the hardmask may have an initial thickness of about 1,000 Å. Specific values may vary depending on, e.g. the fin etch selectivity and the fin height, and can easily be determined by those skilled in the pertinent art.

Figure 1G:
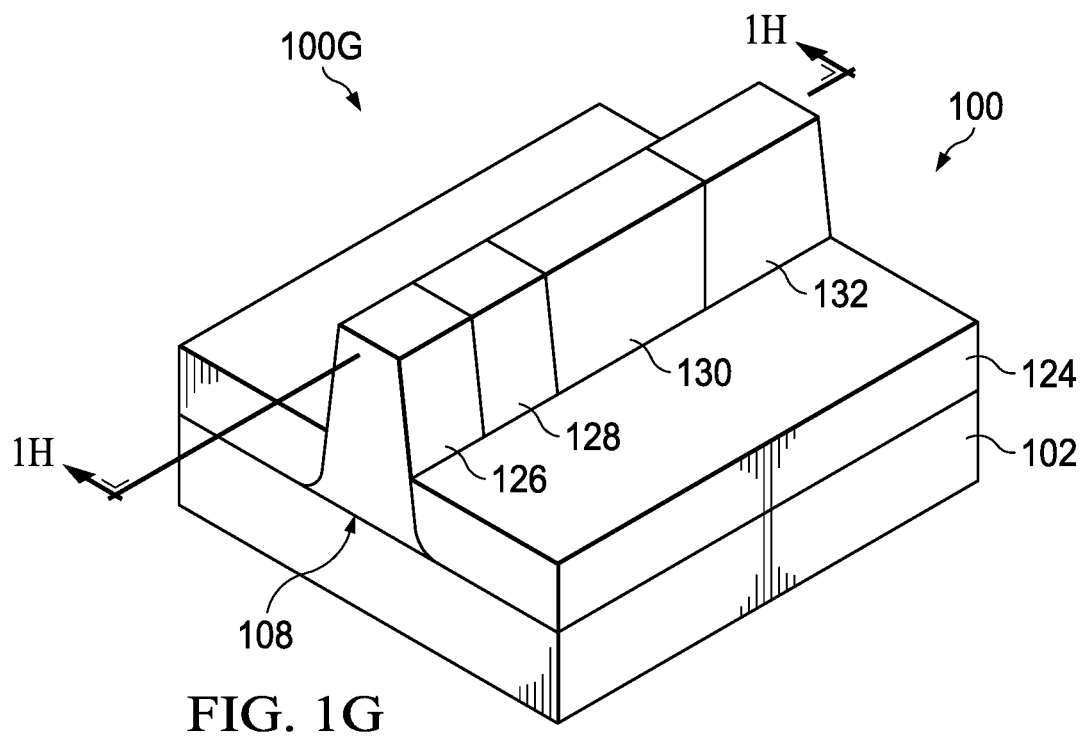

FIG. 1G illustrates a perspective view 100G of the semiconductor fin 108 in which a trench dielectric layer 124 has been formed on the substrate 102 about the semiconductor fin 108. Formation of the trench dielectric layer 124 includes depositing a dielectric material, such as silicon dioxide, on the substrate 102 to fill a space about the semiconductor fin 108 and etching the trench dielectric layer 124 to a desired thickness, thereby exposing a desired height of the semiconductor fin 108. The semiconductor fin 108 is shown separated into different transistor regions, although not all of these transistors regions have currently received the implants by which these regions are defined. In one example implementation, semiconductor fin 108 includes a source region 126, a body region 128, a drift region 130, and a drain region 132. The drift region 130, which is the only region that has been doped thus far, is between and adjacent the drain region 132 and the body region 128. The body region 128 is adjacent and between the source region 126 and the drift region 130.

Figure 1H:
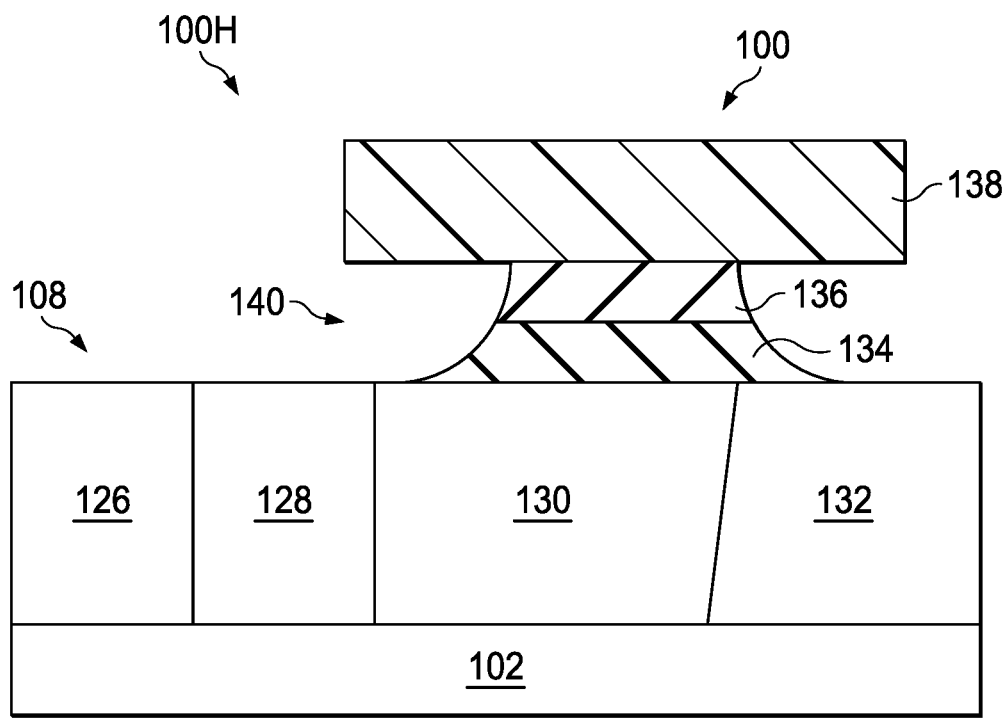
Figure 1I:
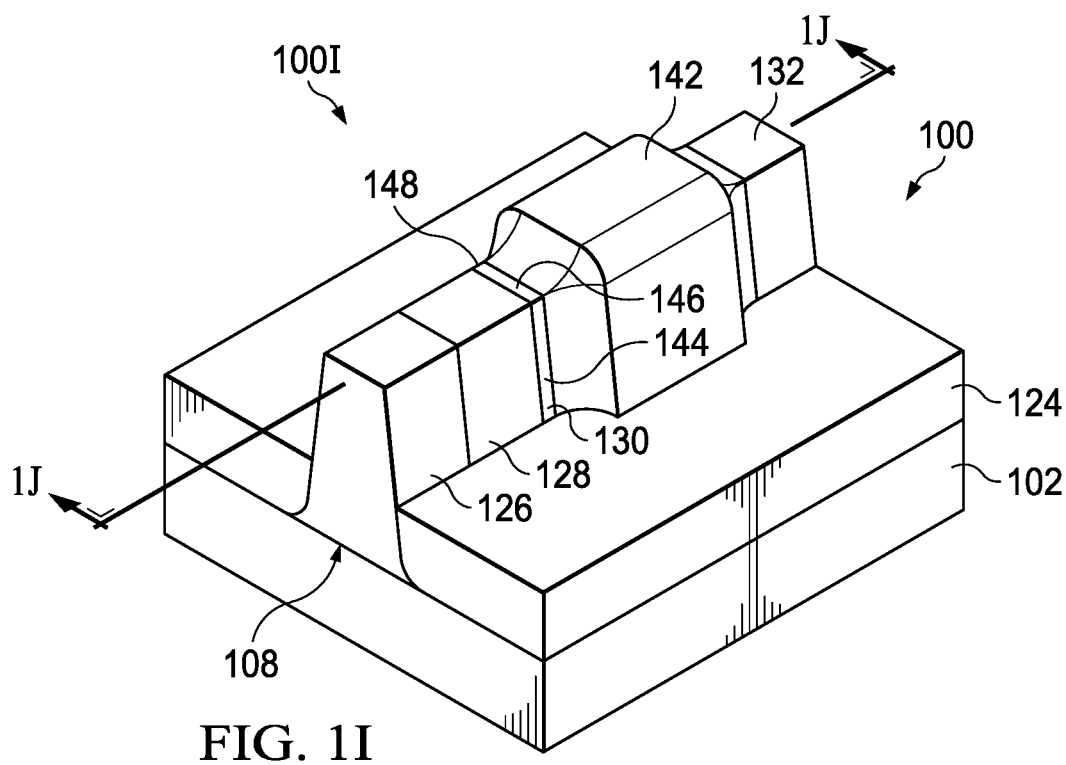

Turning next to FIG. 1H, a cross-sectional view 100H of the semiconductor fin 108 is shown, taken along the line 1H-1H in FIG. 1G. Once dopants have been implanted in the drift region 130 (e.g. by implants 116 in FIG. 1E and 120 in FIG. 1F) and the patterned hardmask 104 removed, a dielectric layer 134 is formed on the semiconductor fin 108 and the trench dielectric layer 124 of FIG. 1G. The dielectric layer 134 may be thermally-grown silicon dioxide and have a thickness of about 30 nm to about 120 nm in some implementations. While the view of FIG. 1H only shows the dielectric layer 134 on the top of the fin 108, this layer also covers sidewalls of the fin 108, as seen in FIG. 1I. In some implementations, a layer of oxide formed from tetra-ethoxysilane (TEOS) 136 may be deposited over the dielectric layer 134. This layer is referred to as TEOS 136 or layer of TEOS to distinguish from other silicon oxide-like layers. Next, a photoresist layer 138 is applied and patterned over the dielectric layer 134 and the layer of TEOS 136, if present. Though not explicitly shown, the photoresist layer 138 covers sidewalls of the semiconductor fin 108 as well. While the patterned photoresist layer 138 is in place, the dielectric layer 134 is etched to create a field plate insulator over the drift region 130 of the semiconductor fin 108. For example, the etching can remove the dielectric layer 134 from the trench dielectric layer 124 and from all surfaces of the semiconductor fin 108 except surfaces of the drift region 130. Wet etching may be applied to remove the dielectric layer 134 and the TEOS 136, with the TEOS 136 selectively removed to a greater extent due to the higher density of the thermally grown dielectric layer 134. The cross-sectional view 100H depicts the dielectric layer 134, the layer of TEOS 136, and the patterned photoresist layer 138 on the semiconductor fin after etching and before removal of the photoresist layer 138. An undercut 140 produced by the etching creates a smooth corner that increases breakdown voltage, relative to a sharp corner (e.g., 90°) that could otherwise increase electric field and decrease breakdown voltage.

FIG. 1I shows a perspective view 100I of the semiconductor fin 108 with a field plate insulator 142 formed on the drift region 130 of the semiconductor fin 108. The field plate insulator 142 may include the dielectric layer 134 (FIG. 1H) and the layer of TEOS 136 (FIG. 1H) and is formed on three sides of the drift region 130, e.g., on a first sidewall 144, a top side 146, and a second sidewall 148. The first sidewall 144 is opposite the second sidewall 148.

Figure 1J:
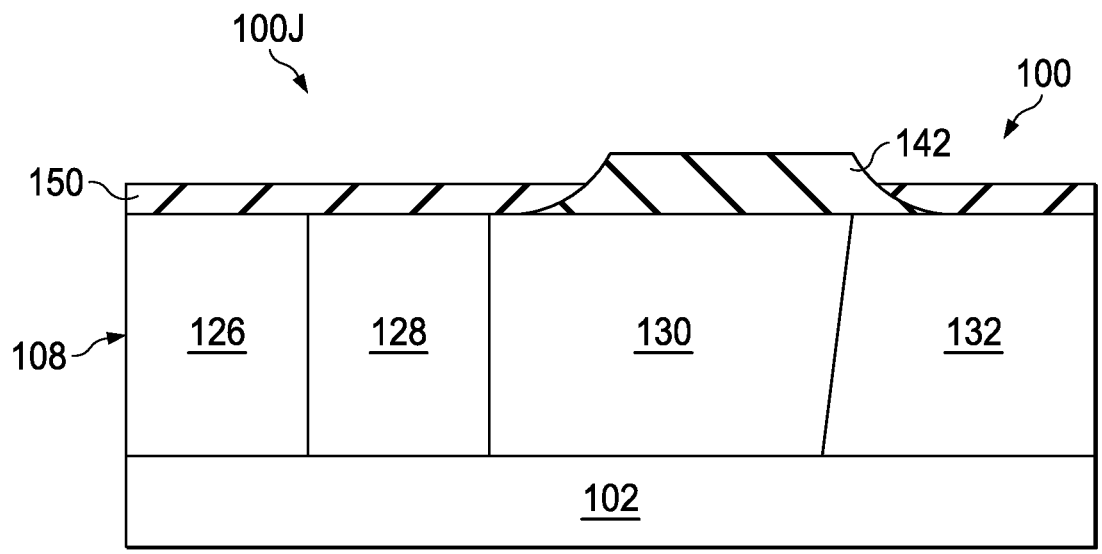

FIG. 1J depicts a cross-sectional view 100J of the semiconductor fin 108, taken along the line 1J-1J of FIG. 1I. In FIG. 1J, the formation of the field plate insulator 142 has been followed by the formation of a gate dielectric layer 150 on the semiconductor fin 108. In one implementation, the gate dielectric layer 150 may be silicon dioxide, and may be thermally grown. The gate dielectric layer 150 is adjacent to and engages the field plate insulator 142.

FIG. 1K again depicts a cross-sectional view 100K of the semiconductor fin 108, in which a conductive layer 152, which may be a doped polysilicon, is deposited on the gate dielectric layer 150 and the field plate insulator 142 of the semiconductor fin 108. A photoresist layer 154 is formed and patterned over the conductive layer 152 and will be used to etch the conductive layer 152 to create a gate electrode.

Figure 1K:
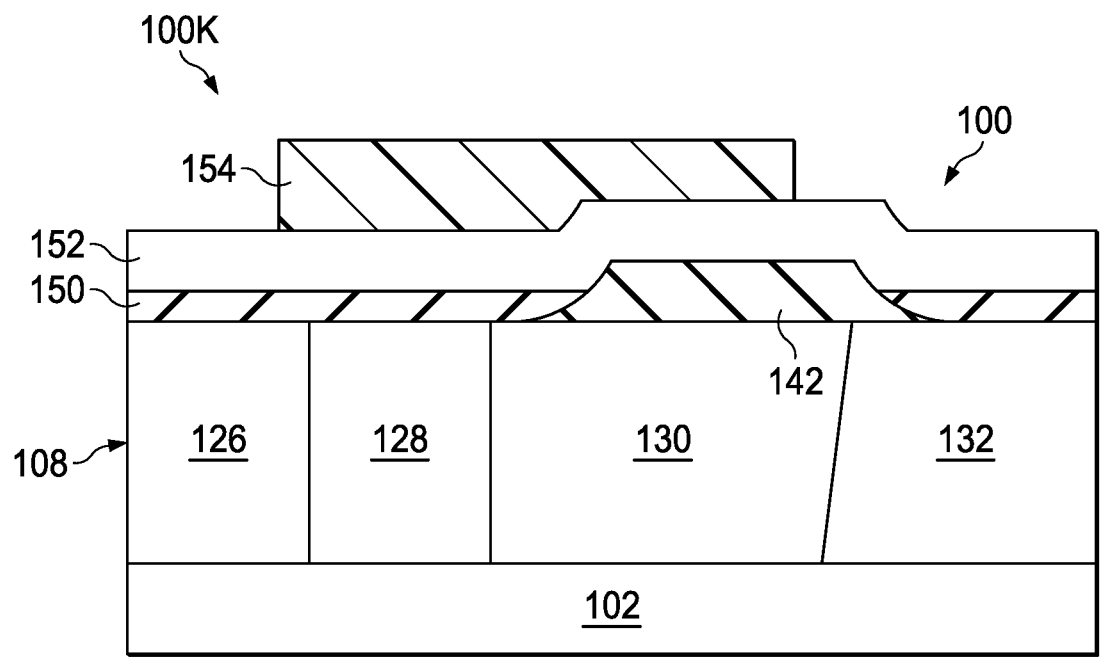
Figure 1L:
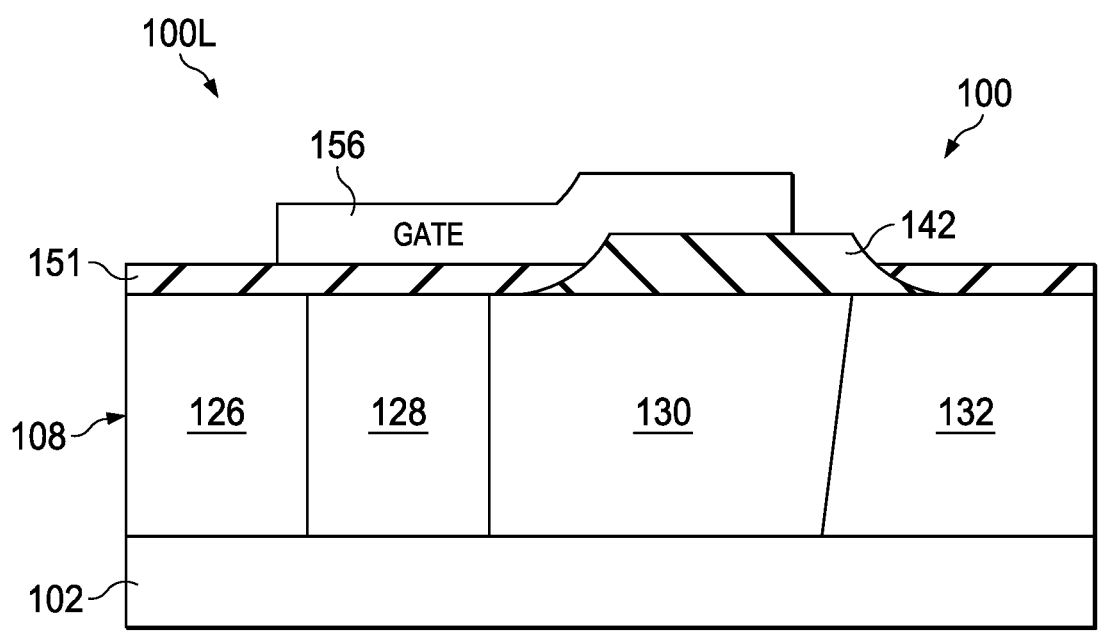

FIG. 1L shows a cross-sectional view 100L that includes a gate electrode 156, which has been formed by etching the conductive layer 152 of FIG. 1K. The gate electrode 156 has been formed partially over the body region 128 and partially over the field plate insulator 142, which is over the drift region 130. A dielectric layer 151, which may include the gate dielectric 150, is shown over the semiconductor fin 108.

Figure 1M:
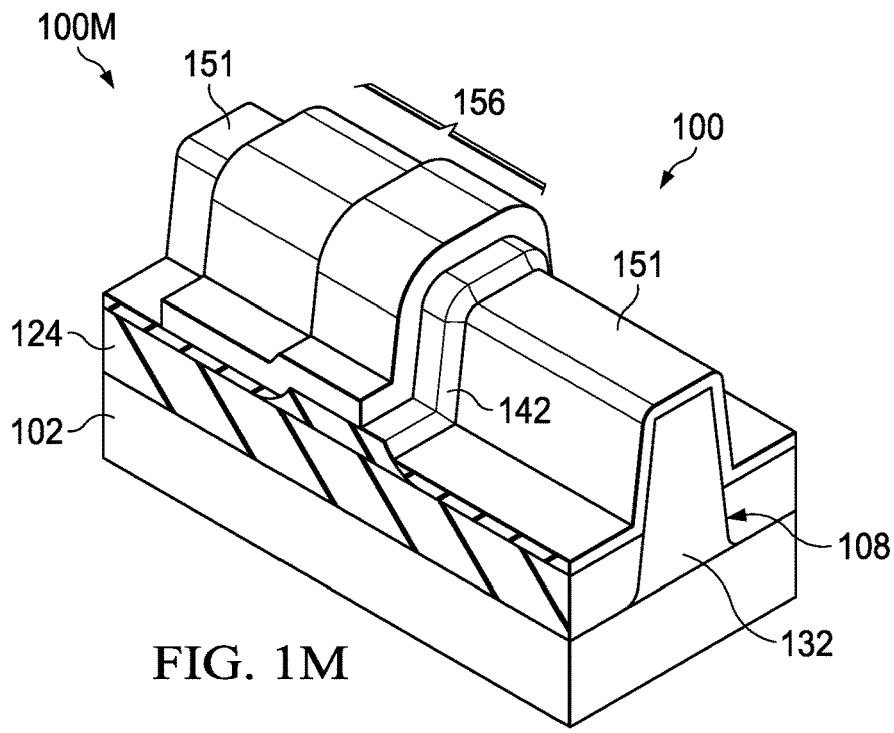

FIG. 1M depicts a perspective view 100M of the structures on the semiconductor fin 108, with a cross-section of the drain region 132 being the only portion of the semiconductor fin 108 that is visible. A portion of the field plate insulator 142 is visible where the field plate insulator 142 is not covered by the gate electrode 156. It can be noted that while a single semiconductor fin 108 is shown in FIG. 1M, two or more semiconductor fins may be formed adjacent to each other such that the gate electrode 156 controls conduction in both the first semiconductor fin 108A (FIG. 1B) and the second semiconductor fin 108B (FIG. 1B). Although processing is not specifically shown past this point, implants into the source region 126 (FIG. 1L) and the drain region 132 (FIG. 1L) and back end of line (BEOL) processing can be performed on the structure of FIG. 1M. For example, metal terminals and/or routing traces are added to the source region 126, the drain region 132, and the gate electrode 156 to provide a gate contact (not specifically shown) on the gate electrode 156, a drain contact (not specifically shown) on the drain region 132 and a source contact (not specifically shown) on the source region 126 (FIG. 1L). Other electronic devices, such as other FinFETS, planar MOSFET, bipolar transistors or resistors may be interconnected with the example FinFET to implement an electronic function of the integrated circuit 100.

Figure 2:
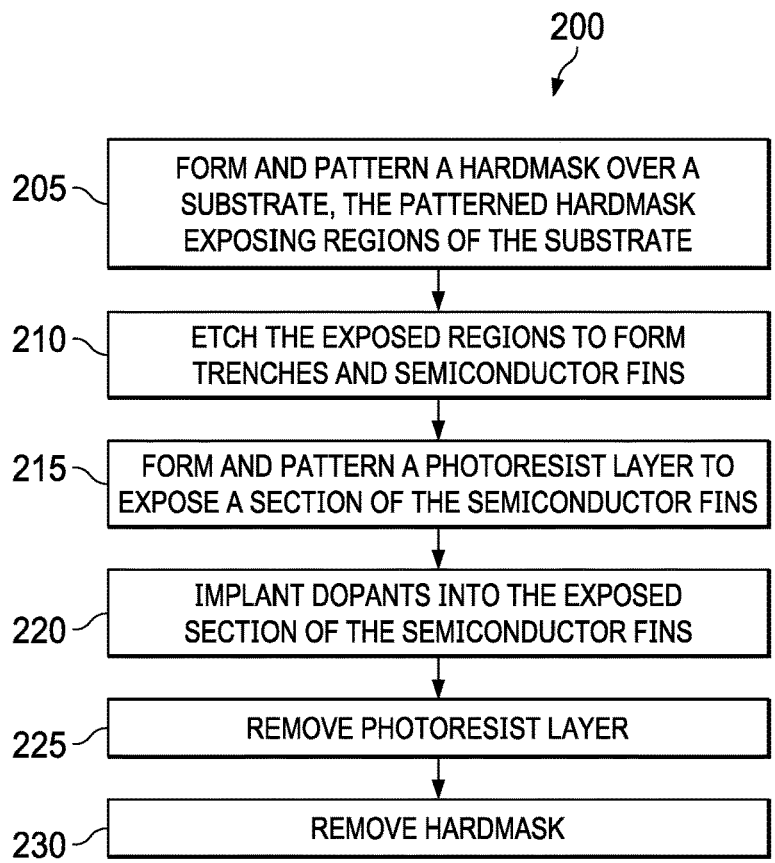
FIG. 2 depicts a method of fabricating an integrated circuit according to an implementation of the disclosure.

FIG. 2 depicts a method 200 of fabricating an integrated circuit, in at least one implementation the integrated circuit includes a FinFET. The method 200 begins with forming and patterning 205 a hardmask over a substrate, the patterned hardmask exposing regions of the substrate. In one implementation, the hardmask may be silicon nitride; in one implementation, the hardmask may be silicon oxide. The exposed regions of the substrate are then etched 210 to form trenches and semiconductor fins between the trenches. In one implementation, a reactive ion etch (RIE) is used to perform etching.

A photoresist layer is formed and patterned 215 on the substrate to expose a section of the semiconductor fins. In one implementation, the semiconductor fins will form Fin-FETs and the exposed section of the semiconductor fins is the drift region of the FinFETs. In one implementation, the semiconductor fins include the sidewalls of trenches and the exposed section is a region whose dopant concentration may be more evenly distributed using the disclosed method.

Dopants are then implanted 220 into the exposed section of the semiconductor fins. In order to implant dopants into all portions of the semiconductor fins, multiple implants may be provided, with each implant using a different angle. In one implementation, a four-rotation implant is used. For an N-type FinFET, the dopants may be any one of phosphorus, arsenic, and antimony; a combination of dopants may also be used, but is not required. In one implementation, two dopants having the same conductivity type may be implanted at different doses and different energy levels as explained in greater detail below. A first dopant may be may be implanted using settings that allow little or no penetration through the hardmask, while a second dopant may be implanted using settings that allow greater penetration through the hardmask.

Once the implants into the exposed section of the semiconductor fins are completed, the photoresist layer can be removed 225 and the hardmask can be removed 230. For an embodiment in which a FinFET is being fabricated, this concludes the implantation of the drift region, which may be the first region to be doped after formation of the semiconductor fins. However, as noted above, the fabrication of the FinFET will continue with formation of a field plate insulator over portions of the drift region, formation of the gate electrode, implanting dopants into the source/drain regions of the FinFETs, and forming contacts to regions of the FinFET as illustrated in FIGS. 1G through 1M.

Figure 5:
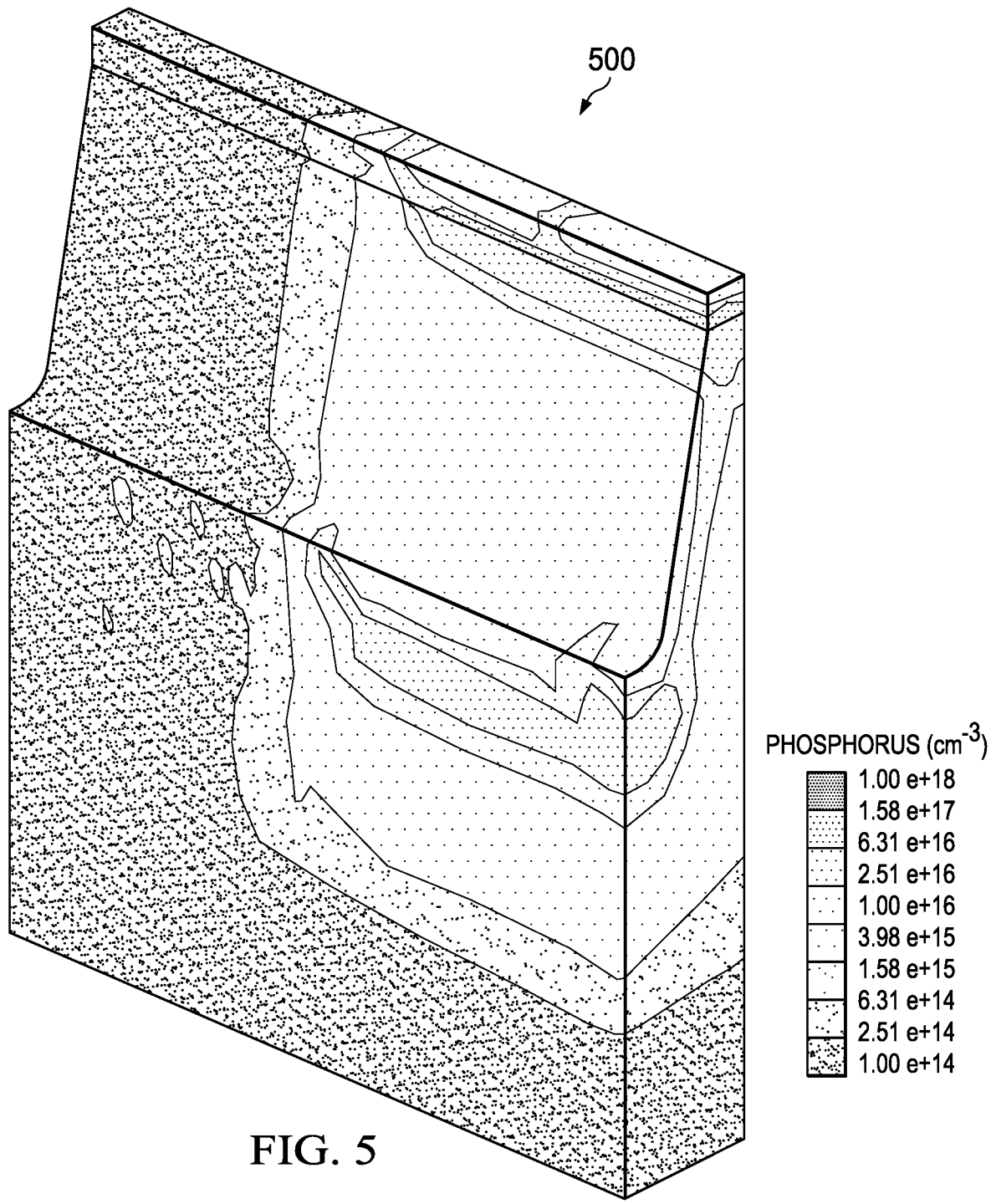
FIG. 5 illustrates a doping profile produced using an example method.

FIG. 5 illustrates a doping profile of a fin 500 produced using an example method consistent with the disclosure, as determined by modeling. The model includes phosphorous implanted with an energy of 35 keV at an angle of 30°, with four rotations. The figure illustrates the fin 500 prior to removing the hardmask. The dopant concentration is seen to vary from about 1e16 cm$^{-3}$ to about 5e16 cm$^{-3}$ at the end of the model fin, and to have no apparent variation near the transition to lightly-doped silicon, a significant improvement in uniformity as compared to the baseline uniformity illustrated in FIG. 3. This improvement is accomplished with reduced process complexity as compared to the oxide screen illustrated in FIG. 4, since the hardmask used to screen the implant at the top of the fin is already used to etch the fin.

When two different dopants having a same conductivity type but different size ions are used to dope a fin, their ability to penetrate any layers placed over the fin may vary significantly and may depend on both the composition of the overlying layer, as well as the dosage and energy used in the implant processes. The '647 application describes the use of two such different dopants to vary the total or net concentration of dopants across the top surface and the sidewall surfaces of a fin. Such techniques may advantageously be applied in combination with the use of the hardmask screen as described herein to further increase uniformity of doping in FinFET devices.

Figure 6A:
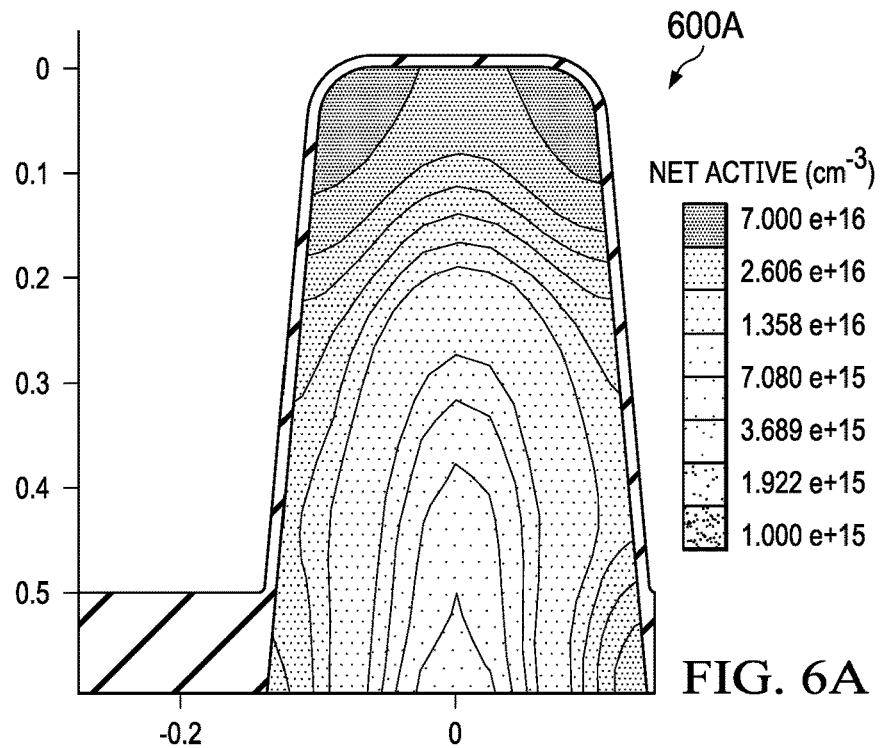
FIGS. 6A and 6B illustrate how the use of two dopants of the same conductivity type but different size ions can provide additional degrees of freedom in a net dopant concentration.

FIG. 6A illustrates a modelled net doping profile of a fin 600A that received both arsenic and phosphorus as dopants. The arsenic was implanted at a dose of 3.5e12 cm$^{-2}$, an energy of 15 keV and a tilt angle of 30°, and the phosphorus was implanted at a dose of 2e12 cm$^{-2}$, an energy of 40 keV and a tilt angle of 30°. This view shows that the net concentration of dopants was heaviest at the top surface and upper sidewalls of the fin and decreased on lower regions of the sidewalls.

Figure 6B:
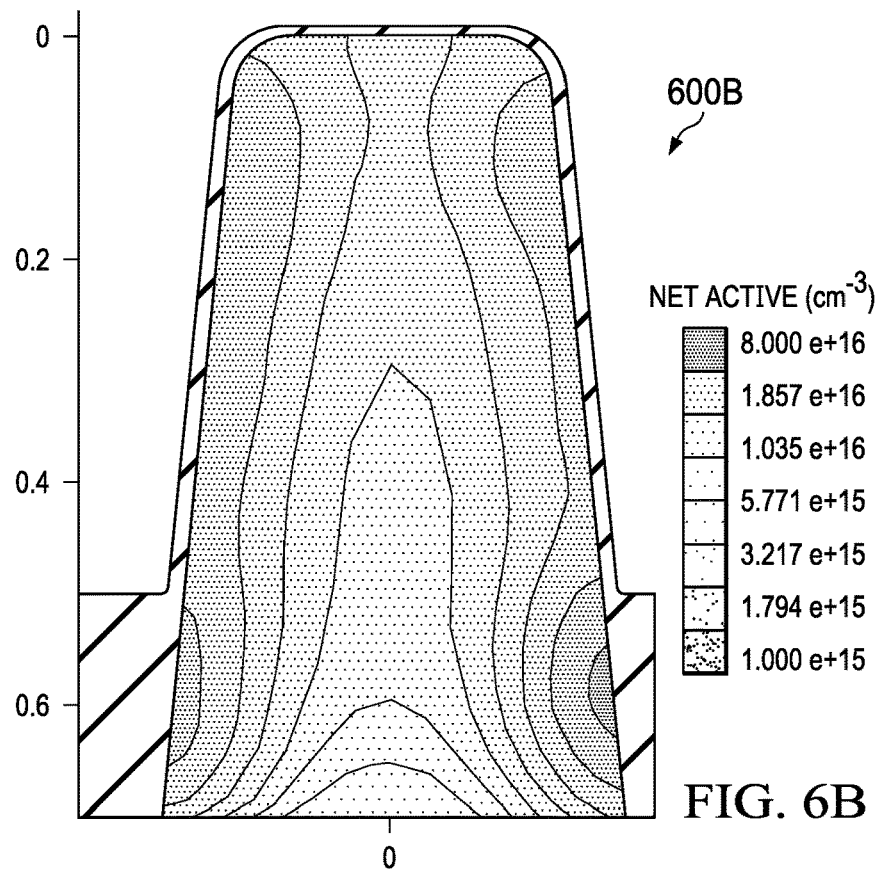

FIG. 6B illustrates a net doping profile of a fin 600B that also received both arsenic and phosphorus, but with different results. In this example, the arsenic was implanted using the same dose, energy and angle as the example of FIG. 6A, while the phosphorus was implanted at a dose of 6e12 cm$^{-2}$, an energy of 20 keV, and a 30° tilt angle. The profile in this simulation differs from the FIG. 6A example in that the heaviest net concentration of dopants is at the lower regions of the sidewalls. The net concentration of dopants decreases on upper sidewalls of the fin and is lowest near the midpoint of the top surface. (While the tilt angle in these examples is the same for both dopants, in general the tilt angle of each dopant may be separately determined to result in the desired dopant distribution.) Combining the use of two dopants having the same conductivity type but different penetration capabilities with the disclosed use of a hardmask to block implants from the top surface may advantageously provide an increased ability to bring the net concentration of dopants across the fin into greater uniformity.

Applicants have disclosed a method of blocking portions of implants for a trench or a FinFET without adding an additional mask. The disclosed method can be part of a larger method of fabricating an integrated circuit that includes the trench or the FinFET. Applicants have also disclosed an integrated circuit that contains a trench or FinFET in which the disclosed method was used. The results of the disclosed method may include greater uniformity in the doping, e.g., in the drift region of a FinFET, at no additional cost to the process and may also include improved performance of the device. Although the method has been described in an implementation for implanting dopants into the drift region of FinFETs, the method can also be used in other situations where multiple implants are performed shortly after a hardmask has been used during silicon etch.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating an integrated circuit, the method comprising:
    forming and patterning a hardmask over a substrate, the patterned hardmask exposing regions of the substrate;
    etching the exposed regions thereby forming trenches and a semiconductor fin between the trenches; and
    prior to removing the hardmask, forming and patterning a photoresist layer thereby exposing a section of the semiconductor fin; and
    implanting a first dopant into the exposed section through the hardmask with a first rotation angle parallel to a long axis of the semiconductor fin and implanting a different second dopant with a second rotation angle nonparallel to the long axis of the semiconductor fin.

2. The method as recited in claim 1 wherein implanting the dopant includes implanting the dopant at multiple angles relative to the substrate such that the dopant is directly implanted into opposite sidewalls of the fin.

3. The method of claim 1 wherein the dopant includes one of phosphorus, arsenic, and antimony.

4. The method of claim 2 wherein implanting the dopant includes implanting a first dopant and a second dopant.

5. The method of claim 1 wherein the semiconductor fins are fins of a fin field-effect transistor (FinFET).

6. The method of claim 5, wherein the dopant is implanted into a drift region of the FinFET.

7. The method as recited in claim 1 including forming a trench dielectric layer over the substrate, the trench dielectric layer covering a lower portion of the semiconductor fins and exposing a portion of the semiconductor fins.

8. The method as recited in claim 1 the first and second rotation angles differ by 90°.

9. A method of fabricating an integrated circuit, comprising:
    forming and patterning a hardmask over a semiconductor substrate, the patterned hardmask exposing regions of the semiconductor substrate;
    etching the exposed regions to form trenches in the semiconductor substrate and a semiconductor fin between the trenches;
    depositing a photoresist layer over the trenches, the semiconductor fin, and the patterned hardmask;
    patterning the photoresist layer to expose a section of the semiconductor fin and the hardmask; and
    implanting a dopant through the exposed hardmask into the exposed section of the semiconductor fin to form a drift region, the implanting including: using multiple implant angles relative to sidewalls of the fin;
    implanting a first dopant having a conductivity type at a first dosage and a first energy, thereby implanting a greater concentration of the first dopant near a top surface of the drift region than near surfaces of the sidewalls of the drift region; and
    implanting a different second dopant having the conductivity type at a second dosage and a second energy, thereby implanting a greater concentration of the second dopant near the surfaces of the sidewalls of the drift region than near the top surface of the drift region.

10. The method as recited in claim 9 including, subsequent to implanting the dopant:
    removing the patterned photoresist and the patterned hardmask; and
    forming a field plate insulator over the top and the sidewalls of the drift region.

11. The method as recited in claim 10 including forming a trench dielectric layer over the substrate, a lower portion of the semiconductor fin being below a top surface of the trench dielectric layer and an upper portion of the semiconductor fin being above the top surface of the trench dielectric layer.

12. The method as recited in claim 11 including forming a gate electrode, the gate electrode extending partially over a top and sidewalls of the field plate insulator and partially over a top and sidewalls of a body region of the semiconductor fin.

13. The method as recited in claim 12 wherein the first and second dopants include two of phosphorus, arsenic or antimony.

14. The method as recited in claim 13 wherein the gate electrode includes doped polysilicon.

15. A method of fabricating an integrated circuit, the method comprising:
    forming and patterning a hardmask over a substrate, the patterned hardmask exposing regions of the substrate;
    etching the exposed regions thereby forming trenches and a semiconductor fin between the trenches; and
    prior to removing the hardmask, forming and patterning a photoresist layer thereby exposing a section of the semiconductor fin and implanting a first dopant and a different second dopant into the exposed section through the hardmask, the first and second dopants having a same conductivity type, the implanting including implanting the dopants at multiple angles relative to the substrate such that the first dopant is preferentially implanted into a top surface of the fin and the second dopant is preferentially implanted into opposite sidewalls of the fin.

16. The method of claim 15 wherein implanting the dopants includes using a four-rotation implant.

17. The method of claim 15 wherein the dopants include two of phosphorus, arsenic, and antimony.

18. The method of claim 15 wherein the semiconductor fins are fins of a fin field-effect transistor (FinFET).

19. The method of claim 18, wherein the dopant is implanted into a drift region of the FinFET.

20. The method as recited in claim 15 including forming a trench dielectric layer over the substrate, the trench dielectric layer covering a lower portion of the semiconductor fins and exposing a portion of the semiconductor fins.

* * * * *